US012658904B2

(12) United States Patent (10) Patent No.: US 12,658,904 B2
Seymour et al. (45) Date of Patent: Jun. 16, 2026

(54) DEVICE AND METHOD FOR PHASE AND BIAS LOCKING

(71) Applicant: XANADU QUANTUM TECHNOLOGIES INC., Toronto (CA)

(72) Inventors: Matthew Seymour, Toronto (CA); Dylan Mahler, Toronto (CA); Leonhard Neuhaus, Ingolstadt (DE); Yanbing Zhang, Toronto (CA); Mohsen Falamarzi Askarani, Ajax (CA); Jonathan Lavoie, Toronto (CA); Xiruo Yan, Toronto (CA); Lars Madsen, Brisbane (AU)

(73) Assignee: XANADU QUANTUM TECHNOLOGIES INC., Toronto (CA)

( * ) Notice: Subject to any disclaimer, the term of this patent is extended or adjusted under 35 U.S.C. 154(b) by 167 days.

(21) Appl. No.: 18/764,295

(22) Filed: Jul. 4, 2024

(65) Prior Publication Data

US 2025/0015790 A1 Jan. 9, 2025

Related U.S. Application Data

(60) Provisional application No. 63/520,119, filed on Aug. 17, 2023, provisional application No. 63/512,092, filed on Jul. 6, 2023.

(51) Int. Cl.
*H03K 17/78* (2006.01)
*H03K 17/00* (2006.01)

(52) U.S. Cl.
CPC .................................. *H03K 17/002* (2013.01)

(58) Field of Classification Search
CPC .... H03K 17/78; H03K 17/785; H03K 17/002; H03K 17/94; H03K 17/941; H03K 17/943; H03K 17/945; H03K 19/14
USPC ................................ 327/365, 407, 530, 564
See application file for complete search history.

(56) References Cited

U.S. PATENT DOCUMENTS 12,126,382 B2 * 10/2024 Padmaraju ........... H04B 10/516
12,376,387 B2 * 7/2025 Simoyama ............ H10F 30/223

* cited by examiner

*Primary Examiner* — Hai L Nguyen

(74) *Attorney, Agent, or Firm* — NORTON ROSE FULBRIGHT CANADA LLP

(57) ABSTRACT

There is described a device and method for utilizing an integrated multiplexer to perform additional functionalities other than signal routing using one or more interleaved input signals. Each interleaved signal includes a data signal interleaved with a proxy signal. In between routing operations of the data signal, the proxy signal from each interleaved signal can be routed to perform phase locking and/or switch bias locking. The routed proxy signal can be interfered with a global reference signal to produce a beat signal, the phase of which can be used to generate a feedback signal to maintain a desired phase relation between the data signal and the global reference signal. The signal strength of the routed proxy signal can also be detected so that a dithering technique may be used to adjust a bias voltage to the MUX switch to maintain an optimal operating state.

20 Claims, 13 Drawing Sheets

Cross
702B
704B
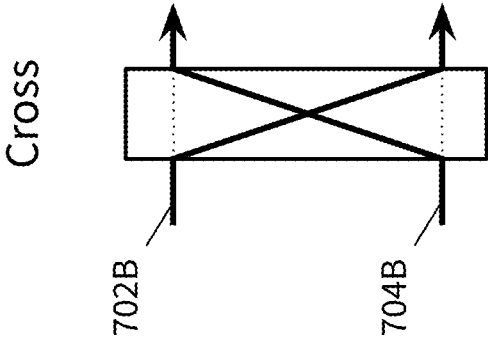
Bar
702A
704A
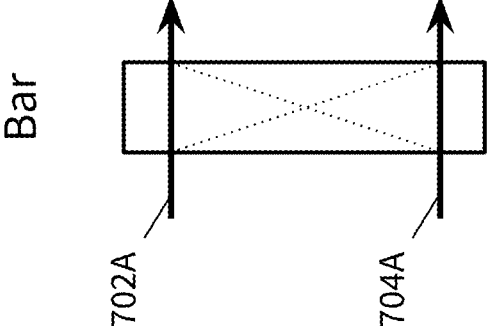
FIG. 7

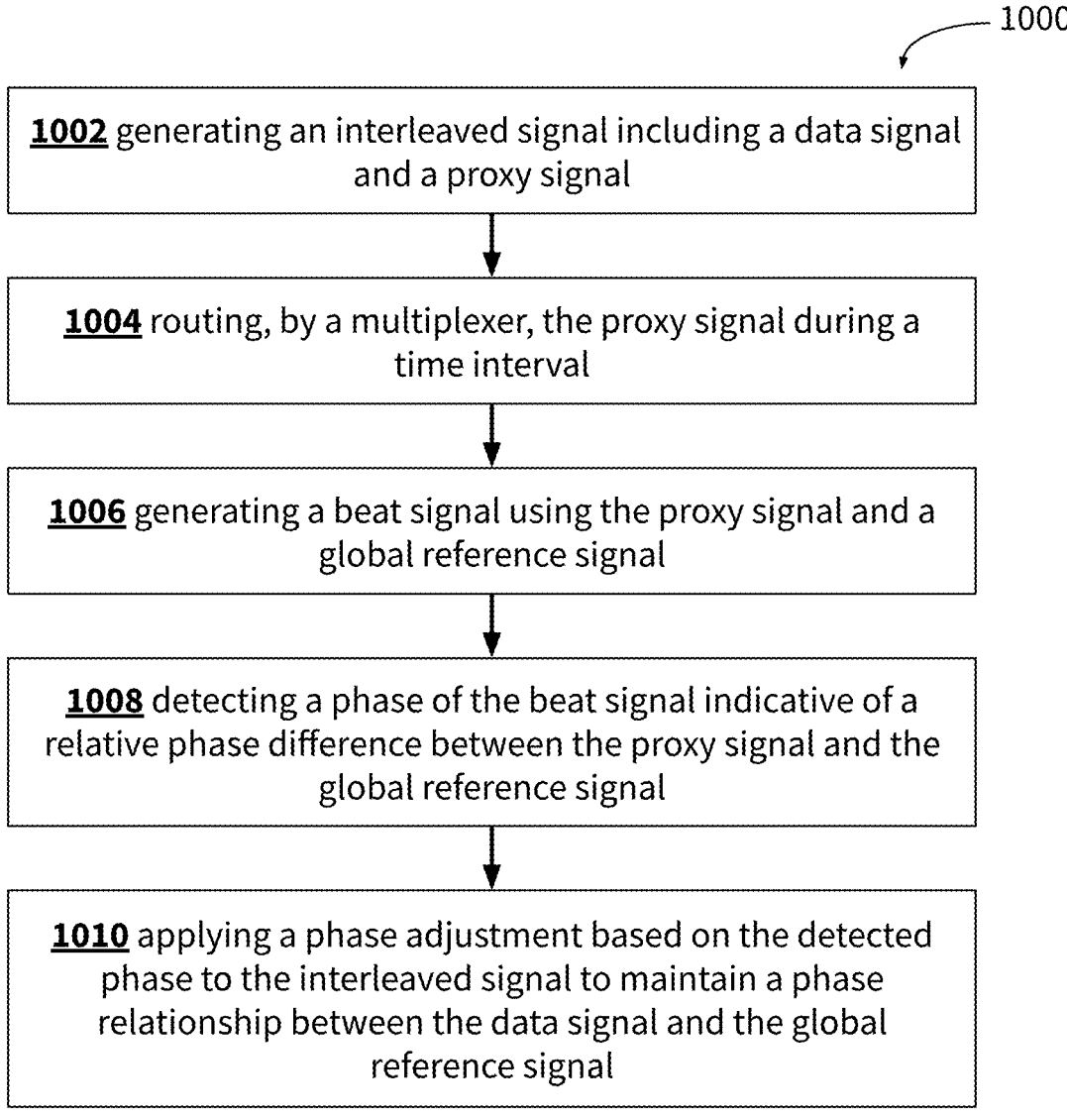

1000

1002 generating an interleaved signal including a data signal and a proxy signal

1004 routing, by a multiplexer, the proxy signal during a time interval

1006 generating a beat signal using the proxy signal and a global reference signal

1008 detecting a phase of the beat signal indicative of a relative phase difference between the proxy signal and the global reference signal

1010 applying a phase adjustment based on the detected phase to the interleaved signal to maintain a phase relationship between the data signal and the global reference signal

FIG. 10

DEVICE AND METHOD FOR PHASE AND BIAS LOCKING

CROSS-REFERENCE TO RELATED APPLICATIONS

This application claims the benefit of, and priority to, U.S. Provisional Patent Application No. 63/520,119, filed Aug. 17, 2023 and titled "DEVICE AND METHOD FOR PHASE AND BIAS LOCKING", and U.S. Provisional Patent Application No. 63/512,092, filed Jul. 6, 2023 and titled "METHOD AND DEVICE FOR PHASE LOCKING", both of which are incorporated herein by reference in their entireties.

BACKGROUND OF THE INVENTION

The present application relates to photonic circuit elements, and in particular to multi-purpose utilization of circuit elements, such as an integrated multiplexer.

Compact photonic integrated circuits (PICs) with relatively low fabrication complexity are desirable for the development of scalable quantum computing platforms. Thus, in one aspect, integrating multiple circuit functions into a single photonic circuit element is an important step towards implementing such applications.

SUMMARY OF THE INVENTION

In some embodiments of the present disclosure, there are provided devices and methods for utilizing an integrated multiplexer in a multi-purpose manner for performing, for example, phase locking and switch bias locking.

In some embodiments of the present disclosure, there is provided a phase locking device and method that is compatible with optical systems, including photonic FTQC architectures.

In some embodiments, the phase locking device and method utilize existing multiplexers to perform phase locking. During alternate time intervals, the multiplexer routes two subsets of input signals, each subset being interleaved with one of two types of proxy signal, to phase detectors. The phase detectors generate beat note signals based on the input signal and a global reference signal. A relative phase difference between the input signal and the global reference signal is extracted from the beat note signals and used to apply a corresponding phase adjustment to each of the signals to maintain a desired phase relationship.

In some embodiments, the number of detectors is half of the number of input signals, thereby decreasing the number of hardware components needed to perform the phase locking.

In some embodiments, two detectors are used for each routed signal to perform balanced detection.

In some embodiments, the global reference signal and the proxy signals are similar in polarization to yield interference.

In some embodiments, the global reference signal and the proxy signals at least partially overlap temporally to produce meaningful beat note signals.

In some embodiments, there is no temporal overlap between the global reference signal and the data signals or between the proxy signals and the data signals.

In some embodiments, the two proxy signals are alternating in consecutive time intervals, thereby rendering the phase locking apparatus immune, at least to a degree, to the limited extinction ratios of the multiplexer switches, which is also known as crosstalk.

In some embodiments, there is provided a switch bias locking device and method that is compatible with optical systems.

In some embodiments, the switch bias locking device and method utilize on-chip MUX(es) to perform the bias locking. Data input signals are temporally interleaved with a proxy signal. The proxy signal of each interleaved signal is routed through a signal path formed by one or more reconfigurable switches of a MUX to a photodetector, which detects a signal strength of the proxy signal. A controller, based on one or more detected signal strengths, adjusts a DC set point bias voltage to one or more switches in order to maintain the switches operating at a desired state.

In some embodiments, the controller implements a dithering technique in determining a set point bias voltage that operates the switches at maximum transmittance in one of a bar or cross configuration.

In some embodiments, the proxy signal strength is determined as an average of a plurality of measurements over a plurality of measurement cycles.

In some embodiments, a set point bias voltage for operating a switch at one of a bar or cross configuration is set as the bias voltage value that is half of a period away, on a response curve of the switch, from a set point bias voltage for operating the switch at the other configuration.

In some embodiments, the minimum transmittance bias voltage for a given switch configuration (bar or cross) is actively determined as the maximum transmittance bias voltage for the other switch configuration.

According to a first example aspect, there is an optical device comprising: a source generating an interleaved signal including a data signal temporally interleaved with a proxy signal; a multiplexer configured to receive the interleaved signal and to route the proxy signal to be used to generate a beat signal indicative of a relative phase difference between the proxy signal and a global reference signal; a detector configured to detect a phase of the beat signal; and a controller configured to apply a phase adjustment to the interleaved signal based on the detected phase to maintain a phase relationship between the data signal and the global reference signal.

According to a second example aspect, there is an optical system comprising: a plurality of sources configured to generate a plurality of interleaved signals, each interleaved signal of the plurality of interleaved signals including a data signal temporally interleaved with a proxy signal; a plurality of detectors, each detector of the plurality of detectors configured to detect a relative phase difference between two signals; a multiplexer configured to route the proxy signal of a first subset of the plurality of interleaved signals to the plurality of detectors during a first time interval where each detector of the plurality of detectors determines a relative phase difference between the proxy signal of an interleaved signal of the first subset of interleaved signals and a global reference signal, and during a second time interval, the multiplexer is configured to route the proxy signal of a second subset of the plurality of interleaved signals to the plurality of detectors where each detector of the plurality of detectors determines a relative phase difference between the proxy signal of an interleaved signal of the second subset of interleaved signals and the global reference signal; and a controller configured to use the relative phase differences determined during the first and second time intervals as feedback signals to maintain a phase relationship between the data signals in the plurality of interleaved signals with respect to the global reference signal.

According to a third example aspect, there is a method comprising: generating an interleaved signal, the interleaved signal including a data signal and a proxy signal; routing the proxy signal through a multiplexer during a time interval; generating a beat signal using the proxy signal and a global reference signal; detecting a phase of the beat signal indicative of a relative phase difference between the proxy signal and the global reference signal; and applying a phase adjustment based on the detected phase to the interleaved signal to maintain a phase relationship between the data signal and the global reference signal.

In any of the above aspects, the interleaved signal may be a first interleaved signal, the data signal may be a first data signal, the proxy signal may be a first proxy signal, the beat signal may be a first beat signal generated during a first time interval, the phase adjustment may be a first phase adjustment, and the phase relationship may be a first phase relationship, and any of the above aspects may further comprise: a second source generating a second interleaved signal including a second data signal temporally interleaved with a second proxy signal; and a second detector; wherein the multiplexer is further configured to receive the second interleaved signal, the second proxy signal is routed to be used to generate a second beat signal indicative of a relative phase difference between the second proxy signal and the global reference signal, and the controller is further configured to apply a second phase adjustment to the second interleaved signal to maintain a second phase relationship between the second data signal and the global reference signal.

In any of the above aspects, the first proxy signal and the second proxy signal may be pulse signals that have the same period and are non-zero in alternating time intervals.

In any of the above aspects, the global reference signal, the first proxy signal, and the second proxy signal may be free of any temporal overlap with the first data signal and the second data signal.

In any of the above aspects, when the global reference signal, the first proxy signal, and the second proxy signal are zero, the multiplexer may be configured to output one of the first data signal and the second data signal based on a routing criterion determined based on the first data signal and the second data signal.

In any of the above aspects, the routing criteria may be a desired photon number resolving (PNR) pattern.

Any of the above aspects may further comprise a first phase shifter configured to apply a first phase adjustment to the first interleaved signal based on the first detected phase of the first beat signal; and a second phase shifter configured to apply a second phase adjustment to the second interleaved signal based on the second detected phase of the second beat signal.

In any of the above aspects, the multiplexer may be a photonic integrated circuit (PIC).

In any of the above aspects, the number of the plurality of interleaved signals may be 2N, where N is a natural number, and the number of the plurality of detectors may be N.

In any of the above aspects, the number of the plurality of interleaved signals may be 2N, where N is a natural number, the number of the plurality of detectors may be 2N, and two detectors of the plurality of detectors may be configured to perform balanced detection on each of the routed interleaved signals during each of the first time interval and the second time interval.

In any of the above aspects, when the global reference signal, the first proxy signal, and the second proxy signal are zero, the multiplexer may be configured to output the data signal of one of the plurality of interleaved signals based on a routing criterion determined based on the data signal of each of the interleaved signals of the plurality of interleaved signals.

In any of the above aspects, the proxy signal of each of the interleaved signals of the plurality of interleaved signals may be one of a first proxy signal and a second proxy signal, the first proxy signal and the second proxy signal being pulse signals that have the same period and are non-zero in alternating time intervals.

In any of the above aspects, the interleaved signal may be a first interleaved signal, the data signal may be a first data signal, the proxy signal may be a first proxy signal, the time interval may be a first time interval, the beat signal may be a first beat signal, and the phase relationship may be a first phase relationship, and any of the above aspects may further comprise: generating a second interleaved signal, the second interleaved signal including a second data signal and a second proxy signal; routing the second proxy signal through the multiplexer during a second time interval; generating a second beat signal indicative of a second relative phase difference between the second proxy signal and the global reference signal; and applying a phase adjustment to the second interleaved signal to maintain a second phase relationship between the second data signal and the global reference signal.

Any of the above aspects may further include configuring the first proxy signal and the second proxy signal such that they alternate between consecutive time intervals.

Any of the above aspects may further include configuring the global reference signal, the first proxy signal, and the second proxy signal to be free of temporal overlap with the first data signal and the second data signal.

Any of the above aspects may further include outputting, by the multiplexer, one of the first data signal and the second data signal based on a routing criterion determined based on the first data signal and the second data signal.

In any of the above aspects, the generating of the beat signal may include interfering the proxy signal with the global reference signal.

In any of the above aspects, the generating may further comprise interleaving a first pump signal and second pump signal with a base proxy signal to produce a combined signal; splitting the combined signal into a first instance and a second instance; applying a temporal delay to the second instance of the combined signal; generating the first interleaved signal comprising the first data signal by a parametric process using the first instance of the combined signal; and generating the second interleaved signal comprising the second data signal by the parametric process using the second instance of the combined signal.

According to a fourth example aspect, there is an optical device comprising: a source generating an interleaved signal including a data signal temporally interleaved with a proxy signal; a photodetector configured to detect a signal strength; a multiplexer configured to receive the interleaved signal, the multiplexer including at least one reconfigurable switch configured to route the proxy signal to the photodetector during a time interval; and a controller configured to apply a set point bias voltage to the at least one reconfigurable switch based on the detected signal strength of the proxy signal to maintain the at least one reconfigurable switch at a desired operational state.

According to a fifth example aspect, there is an optical system comprising: a plurality of sources configured to generate a plurality of interleaved signals, each interleaved signal of the plurality of interleaved signals including a data signal temporarily interleaved with a proxy signal; a plurality of photodetectors, each photodetector of the plurality of photodetectors configured to detect a signal strength; a multiplexer configured to receive the plurality of interleaved signals, the multiplexer including a plurality of reconfigurable switches, each reconfigurable switch of the plurality of reconfigurable switches being configured to route the proxy signal to a photodetector of the plurality of photodetectors during a time interval; and a controller configured to apply a set point bias voltage to one or more reconfigurable switches of the plurality of reconfigurable switches based on the detected signal strength of the proxy signal to maintain the plurality of reconfigurable switches at desired operational states.

According to a sixth example aspect, there is a method comprising: generating an interleaved signal including a data signal temporally interleaved with a proxy signal; routing the proxy signal through at least one reconfigurable switch of a multiplexer during a time interval; determining a signal strength of the routed proxy signal; and applying a set point bias voltage to the at least one reconfigurable switch based on the signal strength to maintain the at least one reconfigurable switch at a desired operational state.

In any of the above aspects, the time interval may be a portion of the time between successive routing operations of the data signal by the at least one reconfigurable switch.

In any of the above aspects, the set point bias voltage may be determined over a plurality of iterations, in each iteration: the controller is further configured to apply a first dithering bias voltage to the at least one reconfigurable switch; the photodetector is further configured to detect a first switch response based on the first dithering bias voltage; the controller is further configured to apply a second dithering bias voltage, different from the first dithering bias voltage, to the at least one reconfigurable switch; the photodetector is further configured to detect a second switch response based on the second dithering bias voltage; and when a rate of change between the first and second switch responses is greater than a threshold value, the controller is further configured to apply an incremental change to the set point bias voltage.

In any of the above aspects, the set point bias voltage may be the average of the first dithering bias voltage and the second dithering bias voltage.

In any of the above aspects, the incremental change to the set point bias voltage may be one of a fixed increment and a proportional value corresponding to the rate of change in the switch response.

In any of the above aspects, the at least one reconfigurable switch may be a lithium niobate switch.

In any of the above aspects, the desired operational state may be at a maximum of a response curve of the at least one reconfigurable switch.

In any of the above aspects, the controller may be further configured to determine a minimum of the response curve.

In any of the above aspects, the controller may be configured to determine the minimum of the response curve as half a period away from the maximum of the response curve.

In any of the above aspects, the proxy signal may be a first proxy signal, the rate of change may be a first rate of change, the set point bias voltage may be a first set point bias voltage, the threshold value may be a first threshold value, the desired operational state may be a first configuration and the first set point bias voltage may correspond to the first configuration, and the controller may be further configured to configure the at least one reconfigurable switch to a second configuration; the multiplexer may be further configured to receive a second proxy signal of a second interleaved signal through the at least one reconfigurable switch, the second proxy signal being offset from the first proxy signal by half of a period of the first proxy signal; and a second set point bias voltage corresponding to the second configuration may be determined over a plurality of iterations, in each iteration: the controller is further configured to apply a third dithering bias voltage to the at least one reconfigurable switch, the photodetector is further configured to detect a third switch response based on the third dithering bias voltage, the controller is further configured to apply a fourth dithering bias voltage, different from the third dithering bias voltage, to the at least one reconfigurable switch, the photodetector is further configured to detect a fourth switch response based on the fourth dithering bias voltage, the controller is further configured to determine a second rate of change between the third and fourth switch responses, and when the second rate of change is greater than a second threshold value, the controller is further configured to apply an incremental change to the second set point bias voltage; and the controller may be further configured to set the second set point bias voltage as the minimum of the response curve of the at least one reconfigurable switch.

In any of the above aspects, the plurality of switches may form one or more signal paths, each signal path of the one or more signal paths being operably coupled to a photodetector of the plurality of photodetectors.

In any of the above aspects, the switches in each signal path of the one or more signal paths may be maintained at desired operational states sequentially.

In any of the above aspects, the determining may further comprise a plurality of iterations, each iteration comprising: applying a first dithering bias voltage to the at least one reconfigurable switch; detecting a first switch response based on the first dithering bias voltage; applying a second dithering bias voltage, different from the first dithering bias voltage, to the at least one reconfigurable switch; detecting a second switch response based on the second dithering bias voltage; and when a rate of change between the first and second switch responses is greater than a threshold value, applying an incremental change to the set point bias voltage.

In any of the above aspects, the incremental change may be a fixed increment.

In any of the above aspects, the incremental change may be proportional to the rate of change.

In any of the above aspects, the desired operational state may be a maximum of a response curve of the at least one reconfigurable switch, and the method may further comprise determining a minimum of the response curve of the at least one reconfigurable switch.

In any of the above aspects, the determining of the minimum of the response curve may further include determining a bias voltage value that is half a period away from the maximum of the response curve of the at least one reconfigurable switch.

In any of the above aspects, the proxy signal may be a first proxy signal, the rate of change may be a first rate of change, the set point bias voltage may be a first set point bias voltage, the threshold value may be a first threshold value, the desired operational state may be a first configuration and the first set point bias voltage may correspond to the first configuration, and the method may further include: configuring the at least one reconfigurable switch to a second configuration; routing a second proxy signal of a second interleaved signal through the at least one reconfigurable switch of the multiplexer, the second proxy signal being offset from the first proxy signal by half of a period of the first proxy signal; determining a second set point bias voltage corresponding to the second configuration over a plurality of iterations, each iteration comprising: applying a third dithering bias voltage to the at least one switch, detecting a third switch response based on the third dithering bias voltage, applying a fourth dithering bias voltage to the at least one switch, detecting a fourth switch response based on the fourth dithering bias voltage, and when a second rate of change between the third and fourth switch responses is greater than a second threshold value, applying an incremental change to the second set point bias voltage; and setting the second set point bias voltage as the minimum of a response curve of the at least one reconfigurable switch.

BRIEF DESCRIPTION OF THE DRAWINGS

Reference will now be made, by way of example, to the accompanying figures which show example embodiments of the present application, and in which:

FIG. 7 illustrates the routing of optical signals through an optical switch operating in two different configurations;

FIG. 10 illustrates a flowchart of an exemplary method of phase locking in accordance with the present disclosure;

Like reference numerals are used throughout the figures to denote similar elements and features. While aspects of the invention will be described in conjunction with the illustrated embodiments, it will be understood that it is not intended to limit the invention to such embodiments.

DETAILED DESCRIPTION OF THE INVENTION

The following is a partial list of acronyms and associated definitions that may be used in the following description:

FTQC: fault-tolerant quantum computing
PNRD: photon-number-resolving detector
GBS: Gaussian boson sampling
MUX/MUXing: multiplexer/multiplexing
PIC: photonic integrated circuit
AOM: acousto-optic modulator Phase Locking Precise control of the phase of optical signals is required for any photonics-based fault-tolerant quantum computing (FTQC) architecture. In general, FTQC architectures include three main subsystems: state preparation, stitching, and measurement. The outputs of the various subsystems may be required to maintain a specific phase relationship (for example, a relative phase of $\pi/2$).

In photonic FTQC architectures, interconnections within and between different subsystems require delay lines. The phase of optical signals travelling through a medium, such as optical fibre delay lines, may be affected by environmental factors (temperature changes, vibrations, etc.) due to changes in the length and refractive index of the medium. Therefore, precise phase control through phase locking is needed within photonic FTQC architectures in order to maintain the required relative phase relationship.

Current methods of optical phase locking, particularly in the context of quantum applications, require additional optical components, such as an optical pick-off for each of the input signals, a phase sensitive photodetector, an electronic comparator, and a corresponding phase shifter for each, or a subset, of the input signals. The extra components may lead to increased loss, additional sources of interference/phase shift, added fabrication cost, and elevated design complexities. This issue may be exacerbated on quantum platforms that require interfacing between multiple photonic integrated circuit (PIC) chips.

In light of the above, it is desirable to have a phase locking device and method that can control the phase of the incoming array of optical signals with decreased hardware requirements. Furthermore, it is desirable for said phase locking device and method to feasibly scale the hardware on a PIC to generate, process or measure a large number of photonic quantum states.

In some embodiments, one or more of the apparatuses and methods described herein utilize existing multiplexers to phase lock two or more input signals on a PIC. Each input signal includes data signals temporally interleaved with proxy signals. The data signals are phase-locked to a global reference signal by determining a phase difference between the proxy signal and the global reference signal and applying a corresponding phase shift to the interleaved signals.

In some embodiments, the device, system, and method described herein may provide a photonic phase locking mechanism and/or methodology with fewer hardware components and reduced fabrication complexity.

Figure 1:
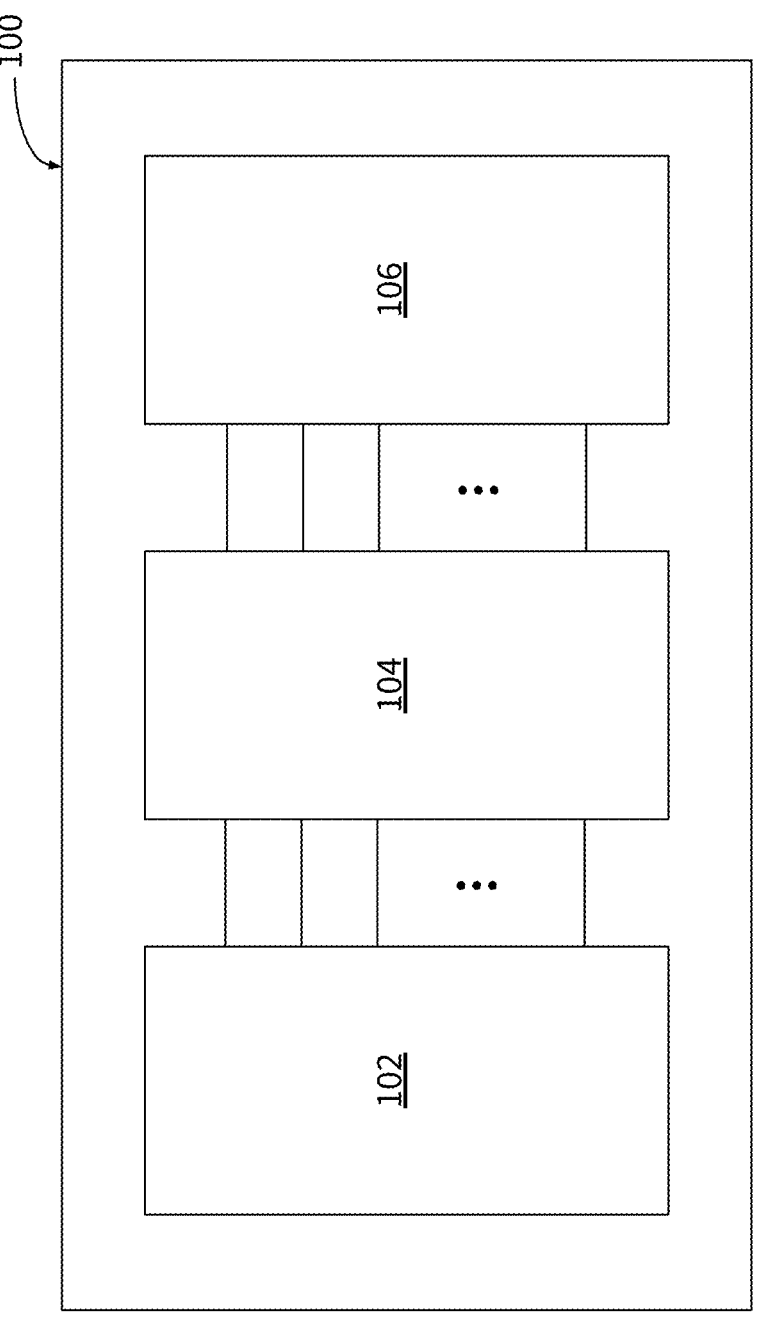
FIG. 1 illustrates a simplified system-level block diagram of an exemplary photonic quantum computing system compatible with embodiments of the present disclosure.

FIG. 1 illustrates a simplified system-level block diagram of an exemplary photonic quantum computing system 100 compatible with embodiments of the present disclosure. The photonic quantum computing system 100 may be configured to perform one or more of: create, generate, shape, measure, decode, or error-correct entangled quantum optical states that serve as a resource for measurement-based fault-tolerant quantum computation. Although described in the context of a photonic quantum computing system, the present disclosure may be adopted for phase locking in other suitable optical systems.

As shown, the system 100 includes a state preparation module 102, a stitcher 104, and a quantum processing unit (QPU) 106. A steady supply of continuous variable (CV)

states of light that include both encoded bosonic qubits and squeezed vacuum states may be generated by the state preparation module 102. The states generated by the state preparation module 102 are provided to the stitcher 104, which is configured to stitch the input states into a lattice structure in accordance with a specific encoding scheme. In some embodiments, the stitcher 104 can interfere the input states, such as through a network of beamsplitters with phase delays, before sending/routing the states to the QPU 106 to be processed for applying gates and performing error correction. Each of the state preparation module 102, the stitcher 104, and the QPU 106 represents logical functionality that can be implemented exclusively via hardware, exclusively via software, or via a combination of hardware and software. Further, the functional delineation between the separate elements within the system 100 may only be a conceptual representation of the overall operation of the system 100.

Figure 2:
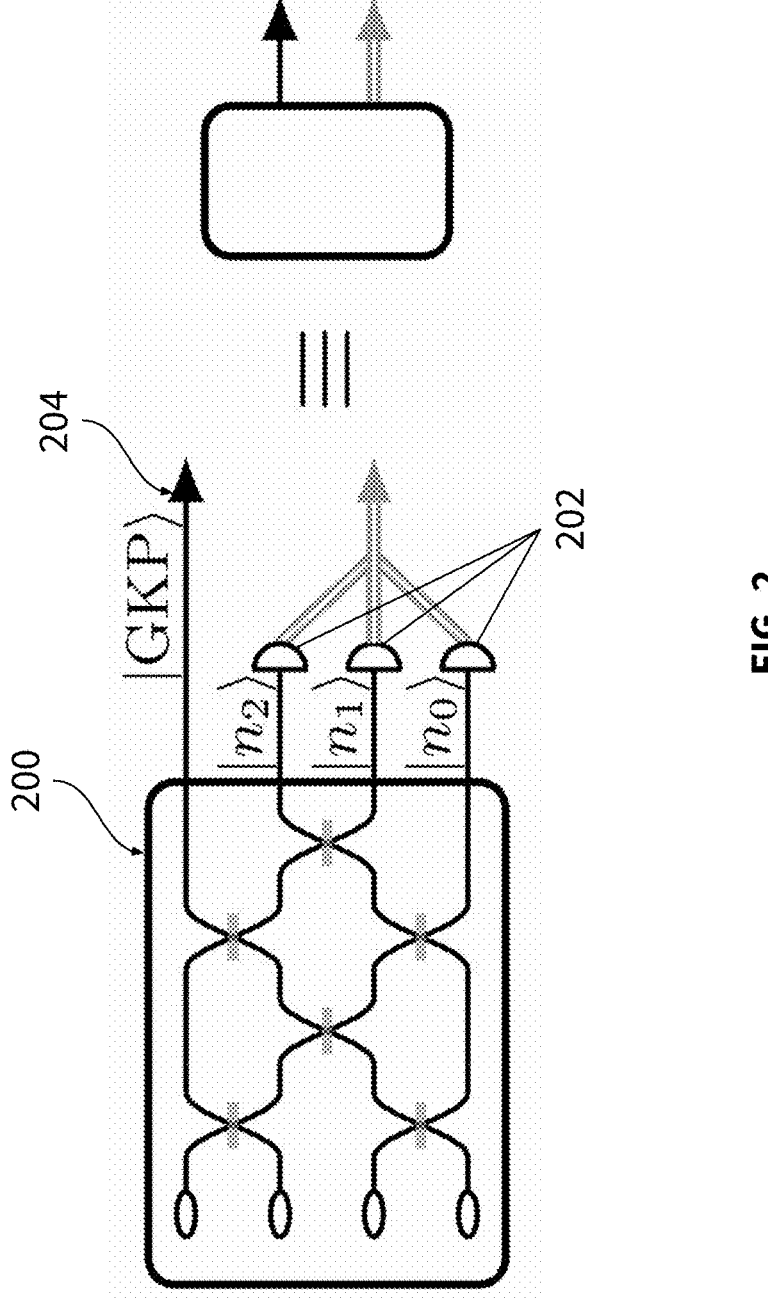
FIG. 2 illustrates an example of a Gaussian Boson Sampling (GBS) device configured to generate approximate GKP states, compatible with some embodiments.

The state preparation module is configured to generate a plurality of input quantum states. In some embodiments, the state preparation module 102 includes a plurality of Gaussian boson sampling (GBS) devices each configured to generate a CV state of light, such as an approximate GKP state. FIG. 2 is a diagram showing a single integrated photonic device 200 compatible with embodiments of the present disclosure configured to implement a GBS-based preparation of non-Gaussian states. A GBS device may be configured to entangle optical modes (which, in this case, are squeezed states of light) and measure all but one optical mode with photon-number-resolving detectors (PNRDs). In FIG. 2, squeezed states in different spatial modes enter an interferometer, and all but one (i.e., $n_0$ through $n_2$) are sent to PNRDs 202. The double lines represent classical logic, which can be used to trigger a switch on the output port 204. The light emitted from the output port 204 is in a chosen non-Gaussian state subject to obtaining the correct photon number pattern $\{n_i\}$ at the PNRDs 202 connected to the remaining output ports. The right portion of FIG. 2 is a simplified representation of a single GBS device. PNRD measurements from the GBS devices provide information regarding the type and quality of states produced, which in turn may be used to set the routing paths of the GBS device output signals through the multiplexers.

High-fidelity state generation of an approximate GKP state from a single GBS device is non-deterministic. Thus, in some embodiments, the state preparation module 102 is configured (e.g., programmed or hard-wired) to perform multiplexing of the bosonic qubits from GBS devices with a MUX to boost qubit generation rates and replace empty modes (i.e., in which multiplexed qubit generation failed) with squeezed vacuum states. "Multiplexing," as used herein, refers to the use of multiple probabilistic qubit generation devices in parallel, and the routing of a successfully generated CV state (i.e., an approximate GKP state) of light in any of these devices to the output. The probability of at least one GBS device from the multiple GBS devices succeeding is higher (i.e., "boosted") as compared with the probability of a single (non-multiplexed) device succeeding.

Figure 3:
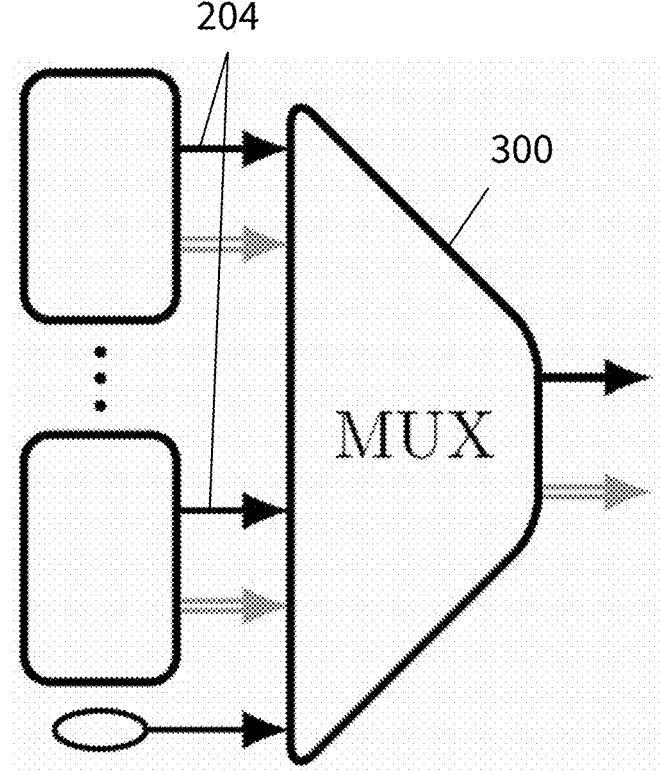
FIG. 3 illustrates an example multiplexer (MUX), compatible with some embodiments.

The specific type of non-Gaussian state produced by the GBS device is non-deterministic—i.e., there is a significant probability that a desired state is not produced. The multiplexing stage is therefore used to allow multiple GBS devices to operate in parallel as a means to increase the probability that a desired non-Gaussian state is acquired. A MUX, including a network of reconfigurable beamsplitters heralded on the PNR outcomes, shuttles the output of a successful GBS device to the next component. In the event that all GBS devices attached to a given MUX fail, the output of the MUX can be "swapped out" for a squeezed state of light, which can be produced deterministically. FIG. 3 shows an example MUX 300 compatible with some embodiments of the present disclosure. The output states of several GBS devices (depicted on the left, similar to that shown in FIG. 2) and one squeezed vacuum state (depicted as an oval) are input to the MUX 300. If at least a single GBS device heralds an approximate GKP state, then that state is output. Otherwise, the squeezed vacuum state is output.

Optical fibre delay lines may be implemented between the GBS devices and the multiplexing stage due to the time required to process and transmit these heralding PNRD measurements. In some embodiments, the MUX may operate at between 50 kHz up to 10 MHz. Thus, the MUX, more specifically the switches within the MUX, may experience a downtime (i.e., time not actively routing signals) of approximately 20 us to 0.1 us between routing operations. Further, the phase of the optical signals travelling through an optical medium (i.e., an optical fibre delay line) may be affected by environmental factors such as temperature variations and vibrations, among others. When multiple GBS devices and MUXes are used in parallel, the output signals from pairs of MUXes may be required to have a specific phase relationship (for example, a relative phase of $\pi/2$). Given the wavelength $\lambda$, frequency f, and period T of light used in these applications (for example, $\lambda=1550$ nm, $f=193$ THz, $T=5.2$ fs), a phase relationship should be maintained with high precision.

Figure 4:
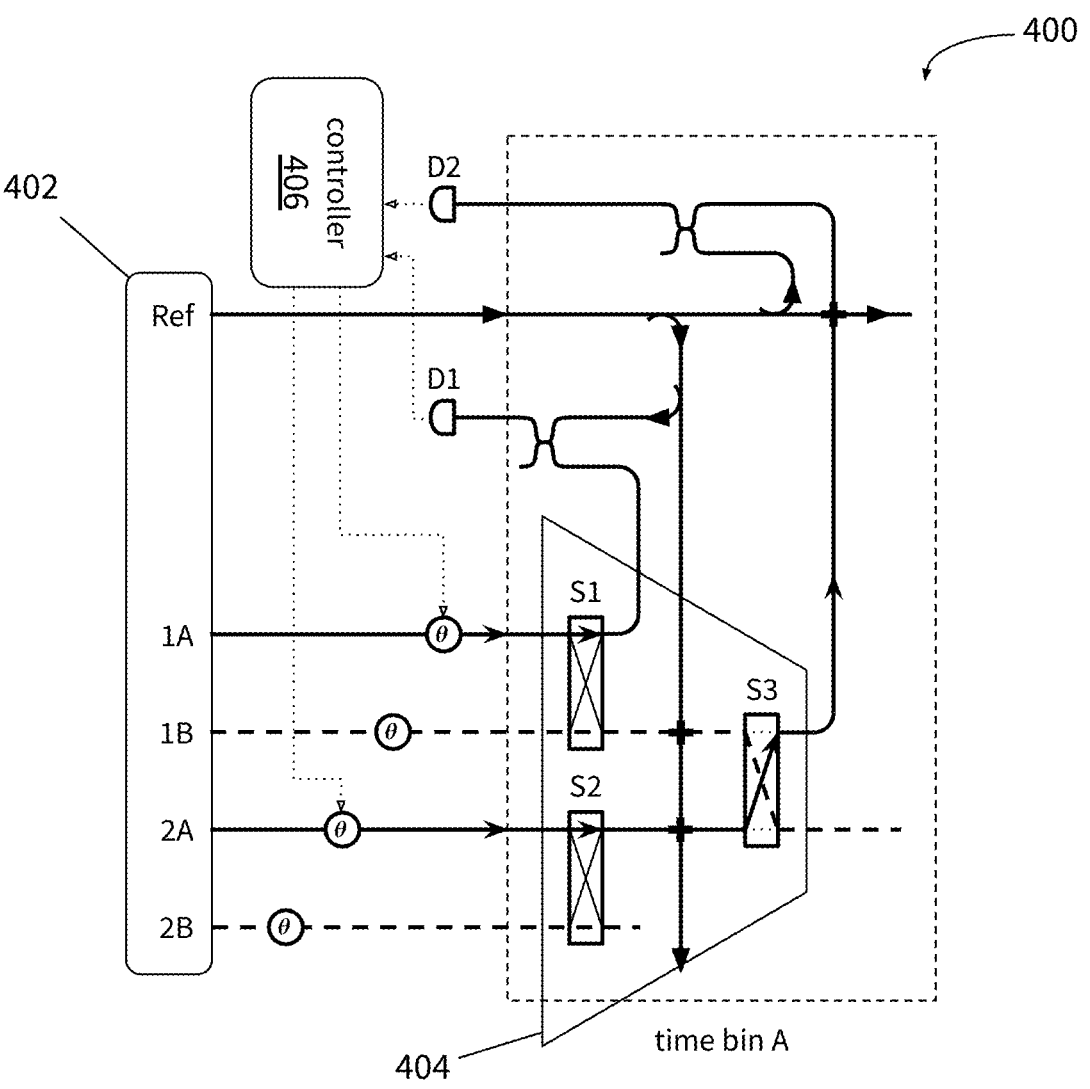
FIG. 4 illustrates an exemplary phase locking system in accordance with the present disclosure.

FIG. 4 illustrates an exemplary phase locking system 400 in accordance with the present disclosure. The system 400 includes a generation module 402 configured to generate interleaved signals 1A, 1B, 2A, and 2B, each comprising a data signal and a proxy signal. The interleaved signals are received by a 4×1 MUX 404 that is configured to phase lock the four input signals. Although four interleaved signals are shown, more or fewer input signals may be accommodated depending on the size of the MUX. In some embodiments, the system 400 may be fabricated onto a PIC.

Figure 5:
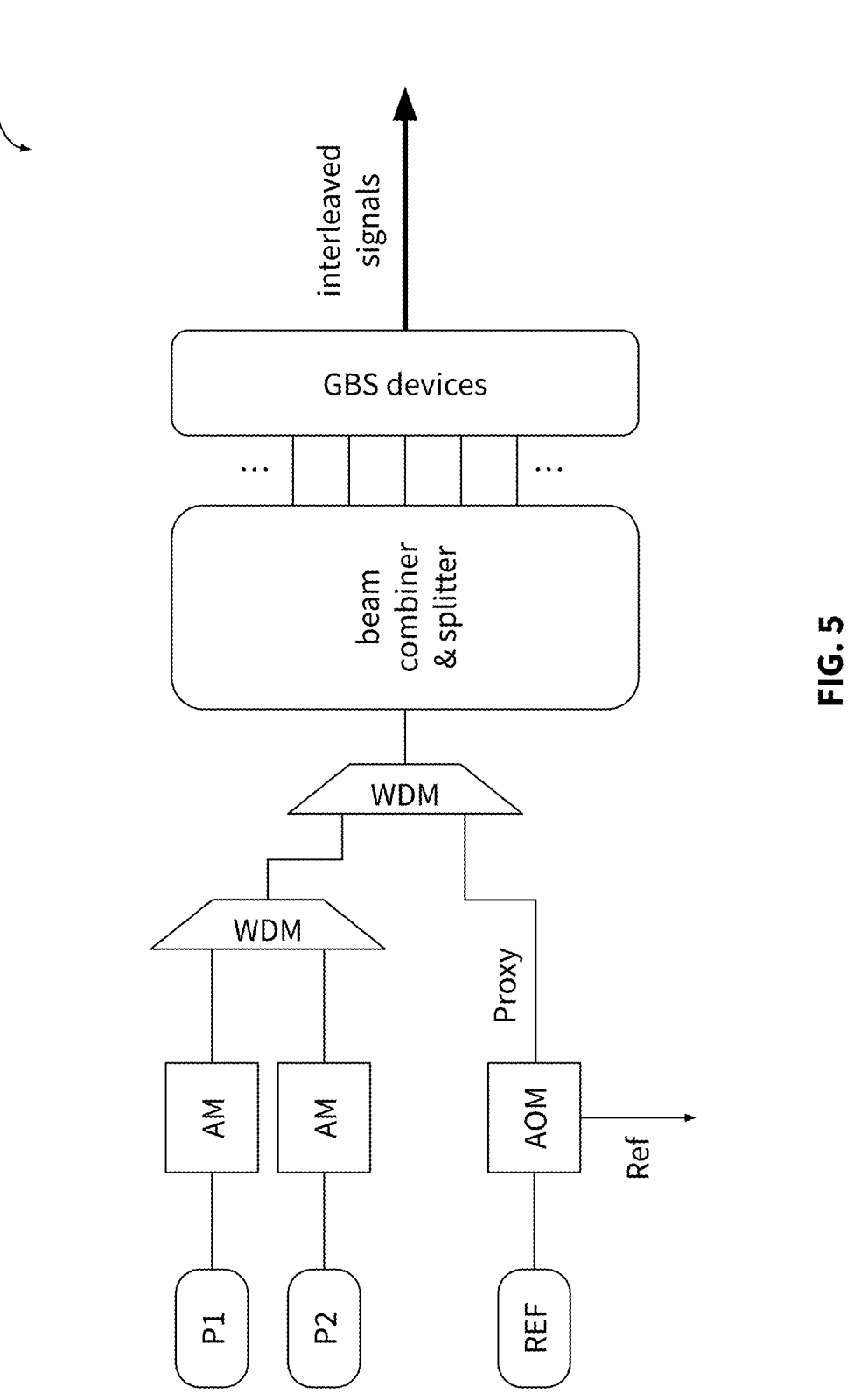
FIG. 5 illustrates an exemplary generation module, compatible with some embodiments.
Figure 6:
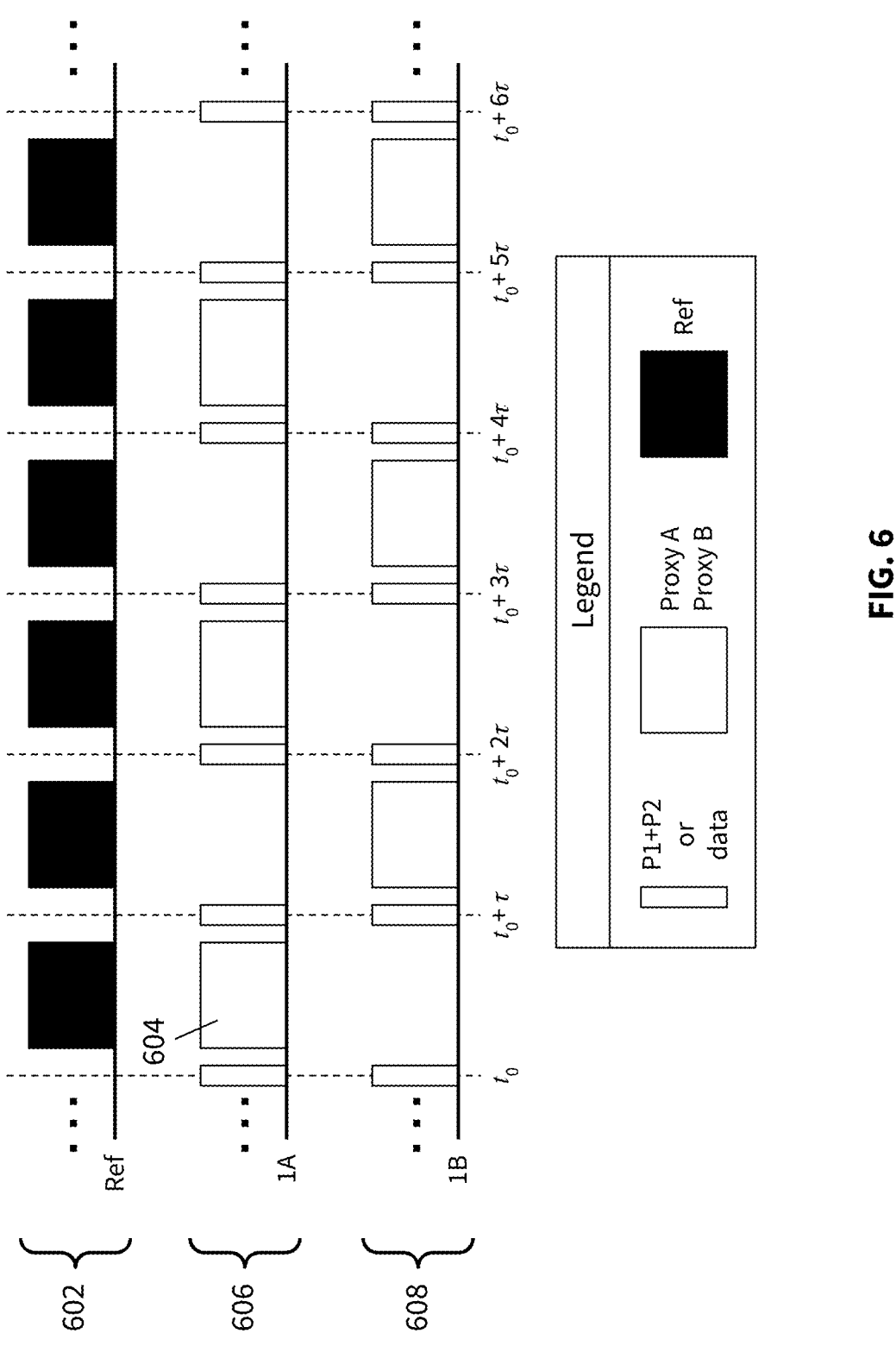
FIG. 6 illustrates a timing graph showing the temporal relationship between the global reference signal and the interleaved signals.

With reference to FIGS. 5 and 6, there is illustrated an exemplary generation module 500 that generates pulsed CV states of light for photonic applications (including photonic quantum computing) interleaved with proxy signals. The generation module 500 may be used to implement the generation module 402 in FIG. 4. The parametric process of degenerate spontaneous four-wave mixing (SFWM) in nanophotonic resonators has been demonstrated as a scalable method to produce pulsed squeezed states between two pump wavelengths with low noise and high spectral purity. In the illustrated embodiment, the generation module 500 includes two pump laser sources P1 and P2, with each pump laser sent to an amplitude modulator (AM) configured to cause the pump lasers to be pulsed, forming two respective pump pulses (e.g., 1 MHz repetition rate with pulse width of 1 to 10 ns). The two pump pulses completely or substantially overlap in the time domain (i.e., same pulse shape) but differ in signal frequency (e.g., separation on the order of MHz, GHz, or THz).

Another laser source REF is configured to generate a continuous light signal which can be split into two or more channels. At least one of the channels may be configured to generate a global reference pulse train, and at least one other channel can be configured to generate a pulsed proxy signal, through acousto-optic modulation, for example. An exemplary global reference pulse train (Ref) is shown as signal 602 in FIG. 6.

FIG. 6 shows an exemplary global reference pulse train 602 and interleaved signals 606 and 608, each of which includes data signals interleaved with pulsed proxy signals 604. In the illustrated embodiment, the proxy signal 604 has a pulse shape of a square wave active (i.e., a high signal) less than half of the pulse train period (to avoid temporal overlap with the data signal) and a pulse train period of $2\tau$, where $\tau$ is the period of the global reference pulse train and the data signals. In further embodiments, the pulsed proxy signal and the global reference pulse train may be of any suitable pulse shape so long as the proxy pulse signal and the global reference pulse train at least partially overlap in the temporal domain. The optical center frequencies of the global reference signal and the proxy signal have a relative difference. In some embodiments, the frequency difference between the global reference signal and the proxy signal may be in the range of 100 kHz to 10 MHz.

Returning to FIG. 5, the P1 and P2 pump pulses and the pulsed proxy signal may be combined into a single optical medium, such as through wavelength-division multiplexers (WDMs). Before combining, temporal delays may be added, such as through the amplitude modulators and/or through careful selection of the fibre lengths, to one or more of the P1 and P2 pump pulses and the proxy signal such that the P1 and P2 pump pulses do not temporally overlap with the pulsed proxy signal. Signal 606 in FIG. 6 shows the temporal structure of the P1 and P2 pump pulses combined with the pulsed proxy signal, where the narrow rectangular signals are the combined P1 and P2 pump pulses and are temporally distinct from the wider rectangular signals that represent the proxy signal pulses. Note that since the P1 and P2 pump pulses completely or substantially overlap in the time domain, they are overlapped in FIG. 6.

The combined signal comprising P1, P2, and the proxy signal is received by a beam combiner and splitter through which multiple copies of the combined signal are generated. A subset (e.g., half) of the combined signals are time delayed (e.g., fed through a time delay optical fibre) such that the proxy signals in the delayed signals do not temporally overlap with those from the combined signals without delay. In some embodiments, a single combined signal (including P1, P2, and the proxy signal) is received by a beam combiner and splitter. The received signal is first split into two instances. One of the two instances is delayed such that the proxy signals in the two instances do not temporally overlap (i.e., they alternate) with each other while the data signal remains unchanged. For example, as shown in the illustrated embodiment in FIG. 6, the proxy signal, which has a period of $2\tau$, is delayed by half a period t, resulting in an instance of the combined signal in the form similar to signal 608 in FIG. 6 while the non-delayed instance is similar to signal 606. The two instances of the combined signal are then further split into a plurality of signals of each type. The data signal and the proxy signal within the delayed instance of the combined signal both experience identical phase shifts that may be introduced by the delay optical fibre. Thus, any additional phase shift introduced may be later corrected during phase locking.

In such embodiments, the alternating nature of the two sets of proxy signals (i.e., those with and without a time delay) minimizes crosstalk in the MUX switches. As at least one of the proxy signals is always zero at any given time, the two interleaved signals directed to a single switch within a MUX during a phase detection cycle may be insensitive to the limited extinction ratio of the switch, which is defined as $10 \log (P_{max}/P_{min})$, where $P_{max}$ and $P_{min}$ are the power transmitted during the "on" and "off" states of the switch, respectively. FIG. 7 illustrates the routing of optical signals through an optical switch operating in two different configurations, in accordance with embodiments of the present disclosure. When operating in the bar configuration, the optical signal 702A at the upper input port is routed to the upper output port, while the optical signal 704A at the lower input port is routed to the lower output port. When operating in the cross configuration, the optical signal 702B at the upper input port is routed to the lower output port, while the optical signal 704B at the lower input port is routed to the upper output port. For the purposes of evaluating the extinction ratio of the switch, one can consider, as an example, measuring the power transmitted from the upper input port to the upper output port. Therefore, the "on" state can be considered to be the bar configuration, where a signal enters the upper input port and is routed to the upper output port. The "off" state can be considered to be the cross configuration, where a signal enters the upper input port and is routed to the lower output port. The duration where each of the proxy signals may temporally overlap with the global reference pulse train is referred to as a phase locking time interval herein. In some embodiments, a period of the proxy signal has two phase locking time intervals and is active for one of them.

Referring back to FIG. 5, each of the duplicated instances of the combined signal is then sent to a GBS device. At each of the GBS devices, the P1 and P2 pulse beams generate data signals in the form of squeezed states of light as they pass through a non-linear optical medium within the GBS device by means of SFWM. During the squeezed state generation, the P1 and P2 pump pulses are at least partially consumed with any remaining portion being filtered out within the GBS device. Due to the nature of the nonlinear optical medium being configured to target specific frequency ranges, the proxy signal may pass through it with a reduced power while maintaining its frequency and temporal properties. The resulting output signal from each of the GBS devices is an interleaved signal in the form of signal 606 or 608 in FIG. 6, but instead of P1 and P2, each of the narrow rectangular signals in the interleaved signal are now a data signal in the form of an encoded approximate GKP state (or, in the case of failed GKP state generation, a squeezed vacuum state) with a signal frequency that is the average of those of P1 and P2 for example.

Referring back to FIG. 4, pairs of the interleaved signals 1A-B and 2A-B are received by switches S1 and S2 of the MUX 404, respectively, the outputs of which are received by switch S3 to be further routed as the output of the MUX. As mentioned above, the MUX 404 is heralded based on the PNR detection patterns to select and route an input data signal to its output. In some embodiments, one or more of the input interleaved signals 1A-B, 2A-B may be fed through time delay loops to allow the detection and processing of the PNR detection patterns before light pulses can reach the MUX. The time period between two consecutive routing operations by MUX 404 is divided into two phase locking time intervals corresponding to the two proxy signals. The routing operation of the MUX 404 is carried out in between the phase locking time intervals (i.e., when the data signals are active) such that only the data signals (i.e., squeezed quantum states) are routed to the output of the MUX.

Figure 8:
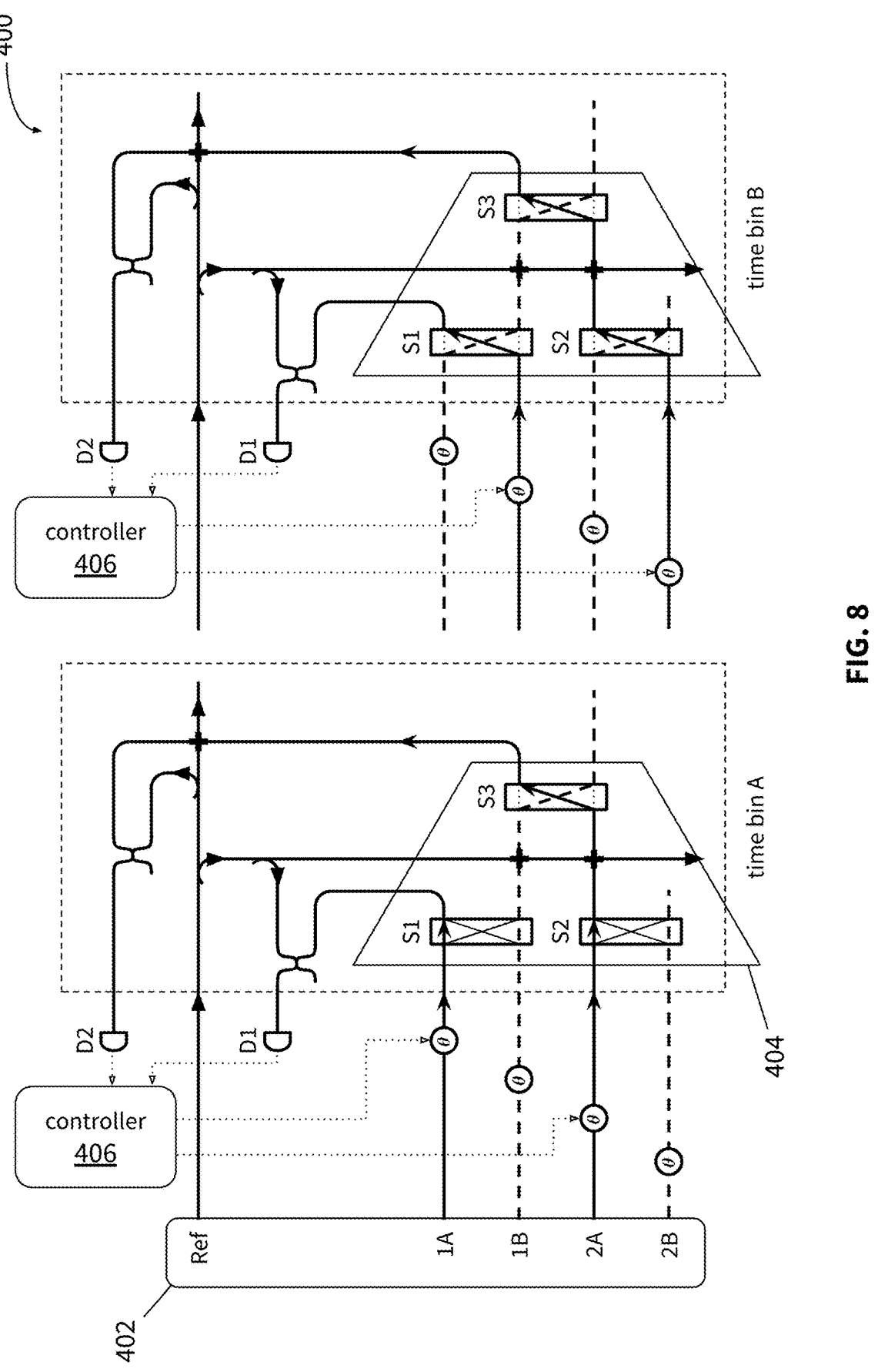
FIG. 8 illustrates signal paths within the phase locking system in FIG. 4 during each of the two phase locking time intervals.

Operations of the MUX 404 during each of the two phase locking time intervals are best illustrated in FIG. 8. Recall that, in some embodiments, the global reference signal and the proxy signal are configured with differing frequencies. In some embodiments, the global reference signal and the proxy signal are interfered with one another through a beamsplitter (e.g., a 50:50 static beam splitter or a reconfigurable beamsplitter). Because of the frequency difference, the global reference signal and the proxy signal gradually and periodically drift between being in-phase and out-of-phase with each other, resulting in constructive interference and destructive interference, respectively, between the two signals. This results in the periodic envelope which is referred to as the "beat note" wherein the frequency of the beat note (also referred to herein as the beat frequency) is given by the absolute difference between the frequency of the global reference signal and the frequency of the proxy signal (e.g., in the range of 100 kHz to 10 MHz in some embodiments).

In some embodiments, one of the two outputs from the beamsplitter may be fed to a photodetector, such as a single-diode photodetector as shown in FIG. 4.

In further embodiments, both beamsplitter outputs may be connected to a two-input photodetector configured to perform balanced detection (i.e., homodyne or heterodyne), which may yield an improved signal-to-noise ratio by allowing for rejection of the undesired common mode. In some embodiments, the detectors D1 and D2 are configured to generate electrical signals indicative of a frequency of the beat signal as a measure of the optical frequency difference between the global reference signal and the proxy signal.

During phase locking time interval A, the first proxy signal (i.e., the proxy signal without time delay) is active. Each interleaved input signal containing the first proxy signal, namely input signals 1A and 2A, are routed to the detectors D1 and D2, respectively. Specifically, interleaved signal 1A is routed to detector D1 via switch S1, and interleaved signal 2A is routed to detector D2 through switches S2 and, subsequently, S3. The global reference signal is split into multiple instances and each instance is interfered, at a beamsplitter, with the proxy signal in each of the routed interleaved signals. Therefore, all instances of the global reference signal should contain the same phase information. In some embodiments, the global reference signal is split on the PIC containing the MUX 404 to ensure minimal signal traversal length to in turn minimize any potential phase change that may stem from propagation or environmental factors such as those that may be experienced by an optical fibre. Therefore, an identical or substantially identical global reference signal may be received by each of the beamsplitters. Each of the beamsplitters outputs at least one heterodyne beat signal based on a frequency difference between the global reference signal and the proxy signal. The beat signal is then demodulated and processed, such as by a controller 406, to provide a feedback signal to a phase shifter (indicated by a circle and labelled with θ in FIG. 4) to apply a corresponding phase shift to maintain a desired phase relationship between the first proxy signal and the global reference signal. The phase shifter may apply the phase adjustment through any suitable methods for controlling the phase of optical signals, including thermo-optic phase shifters (e.g., thermo-electric coolers, resistors) and piezoelectric transducers. Note that since the proxy signal is interleaved with the data signal, the data signals are effectively phase locked with the global reference signal through the phase locking between the proxy signal and the global reference signal.

Similarly, during phase locking time interval B, the second proxy signal (i.e., the time-delayed proxy signal) is active. Each interleaved signal containing the second proxy signal, namely 1B and 2B, are routed to beamsplitters. The resulting heterodyne beat signals are received by the detectors D1 and D2, respectively. The outputs of the detectors D1 and D2 are used to generate a feedback signal to a phase shifter in each of the signal paths of the signals 1B and 2B to phase lock the data signals and the global reference signal. In some embodiments, the phase relationships between each of the data signals and the global reference signal are substantially identical. In other embodiments, the phase relationships may be different and controlled independently.

Figure 9:
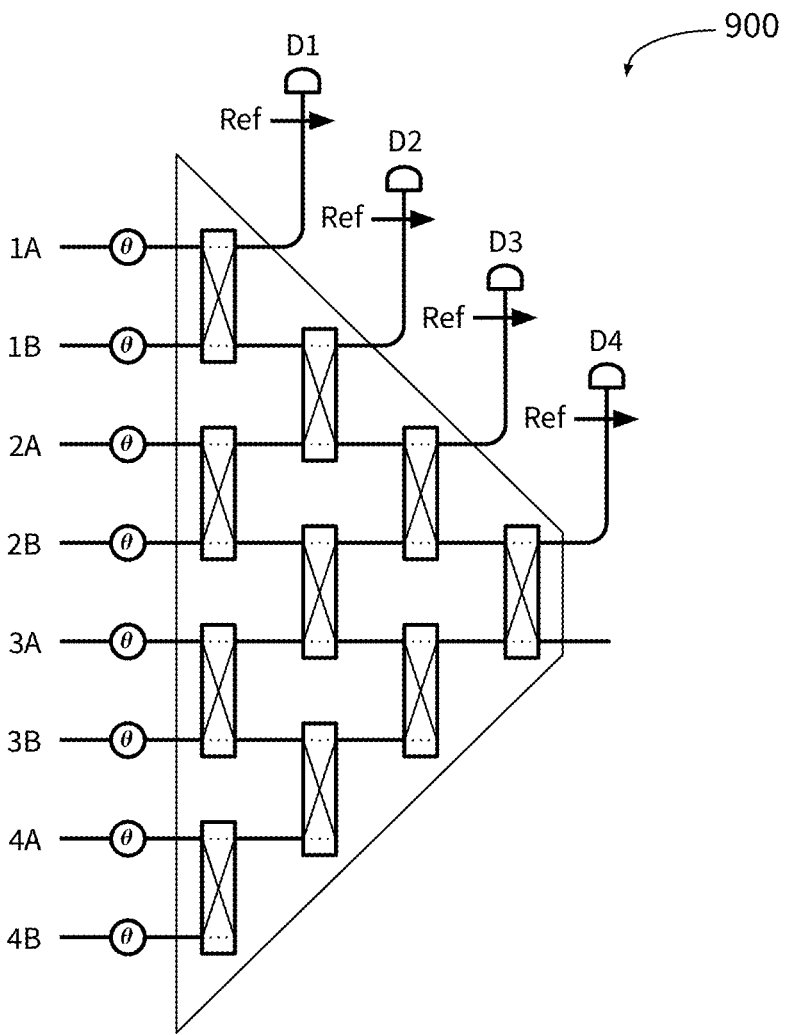
FIG. 9 illustrates an exemplary multi-input embodiment of a phase locking system in accordance with the present disclosure.

The phase locking scheme described with respect to FIGS. 4 to 8 can be extended to systems having a greater number of input signals. In some embodiments, the MUX is configured to receive N inputs, where N is an even number, and the MUX comprises a plurality of switches organized into layers where the number of switch layers is N/2. FIG. 9 illustrates an exemplary 8×1 MUX 900 in accordance with an embodiment of the present disclosure. The MUX 900 is configured to phase lock eight interleaved signals 1A-B, 2A-B, 3A-B, and 4A-B. The input signals are routed through 10 switches within the MUX 900 that are organized into 4 layers as shown such that during each of the first and second phase locking time intervals, half of the interleaved signals may be directed towards the four detectors D1-D4. In the figure, "Ref" is the global reference signal used in beat signal generation. For balanced detection (homodyne or heterodyne), N detectors may be used to perform signal measurement as described above.

FIG. 10 illustrates a flowchart for an exemplary method 1000 in accordance with the present disclosure that may be used for phase locking within an optical system, such as a photonic PIC.

At step 1002, an interleaved signal is generated. The interleaved signal includes a data signal, such as an encoded continuous-variable (CV) state of light, and a proxy signal.

In some embodiments, the interleaved signal may be generated by combining a first pump signal and a second pump signal, and then interleaving the pump signals with a base proxy signal to produce a combined signal. The combined signal is duplicated into multiple instances, each of which is sent to a GBS device. Within each GBS device, copies of the combined signal undergo a parametric process to produce squeezed states of light which are subsequently entangled, and a subset of the optical modes are detected. The pump signals are at least partially consumed within the GBS device. The base proxy signal remains unchanged in terms of phase and frequency.

Each GBS device then outputs an interleaved signal comprising a data signal (i.e., a CV state of light) and the base proxy signal. In some embodiments, a temporal delay is applied to one or more of the combined signals before being sent to the GBS devices. In some embodiments, the base proxy signal is a square pulse wave that is active for just less than half of the signal period such that they do not temporally overlap with the data signals. The temporal delay applied to one or more of the combined signals is half of a period of the base proxy signal, resulting in a subset of the interleaved signals having a first proxy signal (without temporal delay) and another subset having a second proxy signal (delayed by half of a period). Such an arrangement results in the two proxy signals being active in an alternating fashion between two consecutive phase locking time intervals. This proxy configuration may minimize crosstalk at MUX switches due to limited switch extinction ratios.

At 1004, the proxy signal of the interleaved signal is routed, by a multiplexer, towards a photodetector during a time interval. The time interval may be any time between two successive routing operations of the data signal. In embodiments with two subsets of interleaved signals, the proxy signals are routed in an alternating fashion where the first proxy signals are routed during a first phase locking time interval, while the second proxy signals are routed during a second phase locking time interval.

At 1006, the routed proxy signals are used to generate a beat signal that is indicative of a relative phase difference between the proxy signal and a global reference signal. The global reference signal may be a pulsed square wave with half of the period of the proxy signal. The global reference signal at least partially temporally overlaps with the proxy signal but does not temporally overlap with the data signal.

At 1008, a photodetector is used to detect a phase of the beat signal as an indication of the phase difference between the proxy signal and the global reference signal. As the proxy signal is interleaved with the data signal, their phase difference also represents the phase difference between the data signal and the global reference signal.

At 1010, a corresponding phase adjustment based on the detected phase is applied, such as through a phase shifter, to the interleaved signal to maintain a desired phase relationship between the data signal and the global reference signal.

In some embodiments, the MUX is configured to route and output one of the data signals based on a routing criterion. For example, the routing criterion may be determined based on aspects of the data signals. By way of a non-limiting example, in the case of quantum photonic platforms, the routing criterion may be a specific PNR photon-number pattern.

Bias Locking

In accordance with another aspect of the present disclosure, the MUX, such as MUX 300, may be used to perform MUX switch bias locking. MUXes compatible with the present disclosure may include one or more reconfigurable switches, such as lithium niobate switches, having a continuous analog switch response profile. In some embodiments, each switch may include a balanced MZI with a push-pull electro-optic (EO) phase control, which requires a DC bias voltage point to initialize the transmittance to 1 or 0 (i.e., to set the operational configuration of the switch to bar or cross). A suboptimal DC bias voltage could lead to less than maximum signal power transmission through each switch and/or permit undesired signal mixing from other inputs into the output of the switch. The signal loss stemming from suboptimal MUX switches could be compounded as the same signal is propagated through multiple layers of switches within the MUX. Thus, it is preferable to set the operating bias voltage, also referred to as a set point bias voltage, at an optimal operating point of the switch's transmittance response profile to ensure maximum transmittance of a signal through the MUX. Additionally, an initially established optimal transmittance point may drift during operation due to changes in temperature and/or the movement of charged defects in the lattice structure of the switch material. The drift could span the entire bias voltage range, in which case, without tracking and identifying DC bias voltage, the circuit may be rendered inoperable as it would then be impossible to ascertain the operational state (i.e., either bar or cross) of the MUX switches. Thus, the set point bias voltage may need to be continually maintained or "locked" at the optimal operating point during operation of the MUX.

Figure 11:
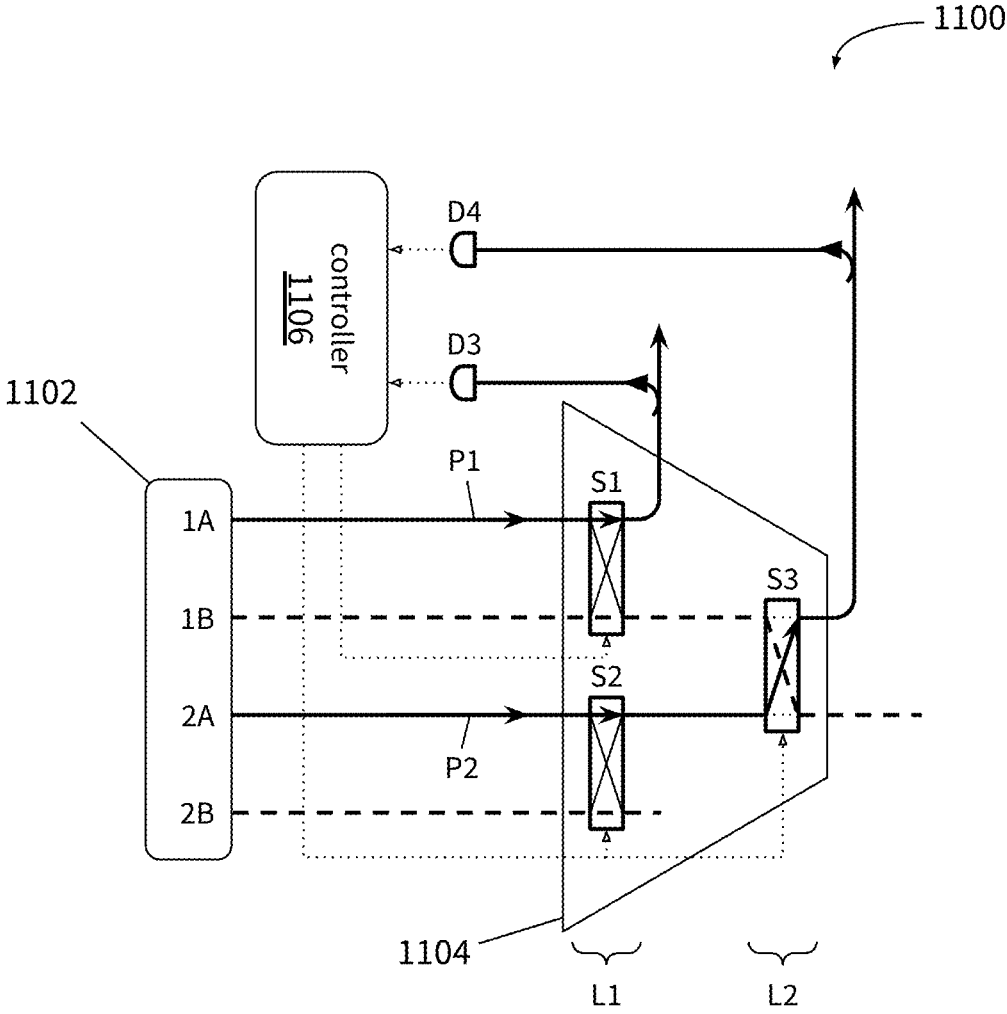
FIG. 11 illustrates a simplified block diagram of a bias locking device in accordance with the present disclosure.

FIG. 11 illustrates a simplified block diagram of a bias locking device 1100 in accordance with the present disclosure. The device 1100 includes a generation module 1102, which may be implemented using generation module 500, that is configured to generate interleaved signals 1A, 1B, 2A, and 2B, each comprising a data signal and a pulsed proxy signal. The interleaved signals are received by a 4×1 MUX 1104 that is configured to perform set point bias voltage tuning of the one or more switches S1-S3 within the MUX. Although four interleaved signals are shown, more or fewer input signals may be accommodated depending on the size of the MUX.

As shown, the switches S1-S3 may be conceptualized as being organized into layers L1, L2, with each layer forming a level of signal propagation within the MUX 1104 where signals output from switches in layer L1 (S1 and S2) are routed to switches in layer L2 (S3). Additionally, the switches may also be conceptualized as being organized into one or more signal paths. For example, in the illustrated embodiment of FIG. 11, switch S1 forms signal path P1 and switches S2 and S3 form signal path P2. In some embodiments, the signal paths P1 and P2 are the same as those used for phase locking described above. One photodetector is configured to perform bias locking for the switches in each signal path.

The switches of the MUX 1104 are configured by a controller 1106 to alternate between performing two types of routing operations: to route the data signal in accordance with a routing criteria and to route the proxy signal towards the detector for bias locking. The time between successive data signal routing operations is referred to as the bias locking time interval. In some embodiments, the bias locking time interval may be defined by the pulse duration of the proxy signal. In some embodiments, the system is configured to perform both bias locking and phase locking as described herein. In such embodiments, the bias locking time interval may coincide with the phase locking time interval. For example, in embodiments where the phase locking scheme includes a pair of alternating first and second proxy signals active during alternating successive time intervals, one of the two proxy signals may be used for bias locking.

During the bias locking time interval, the switch may be set by controller 1106 to one of its two operational configurations: the cross configuration or the bar configuration. The switch(es) within each signal path are of a fixed combination of switch configurations in order to route the proxy signal of one of its input interleaved signals towards the photodetector operably coupled to the signal path. For example, switch S1 is in its bar configuration to route the proxy signal of the interleaved signal 1A to photodetector D3, while switches S2 and S3 are in the bar and cross configurations, respectively, in order to route the proxy signal of interleaved signal 2A to photodetector D4. Each of the photodetectors D3 and D4 are configured to detect a signal strength of their received proxy signal. For example, the signal strength may be measured in intensity, power, number of photons, or any other suitable photonic properties.

Figures 12A, 12B:
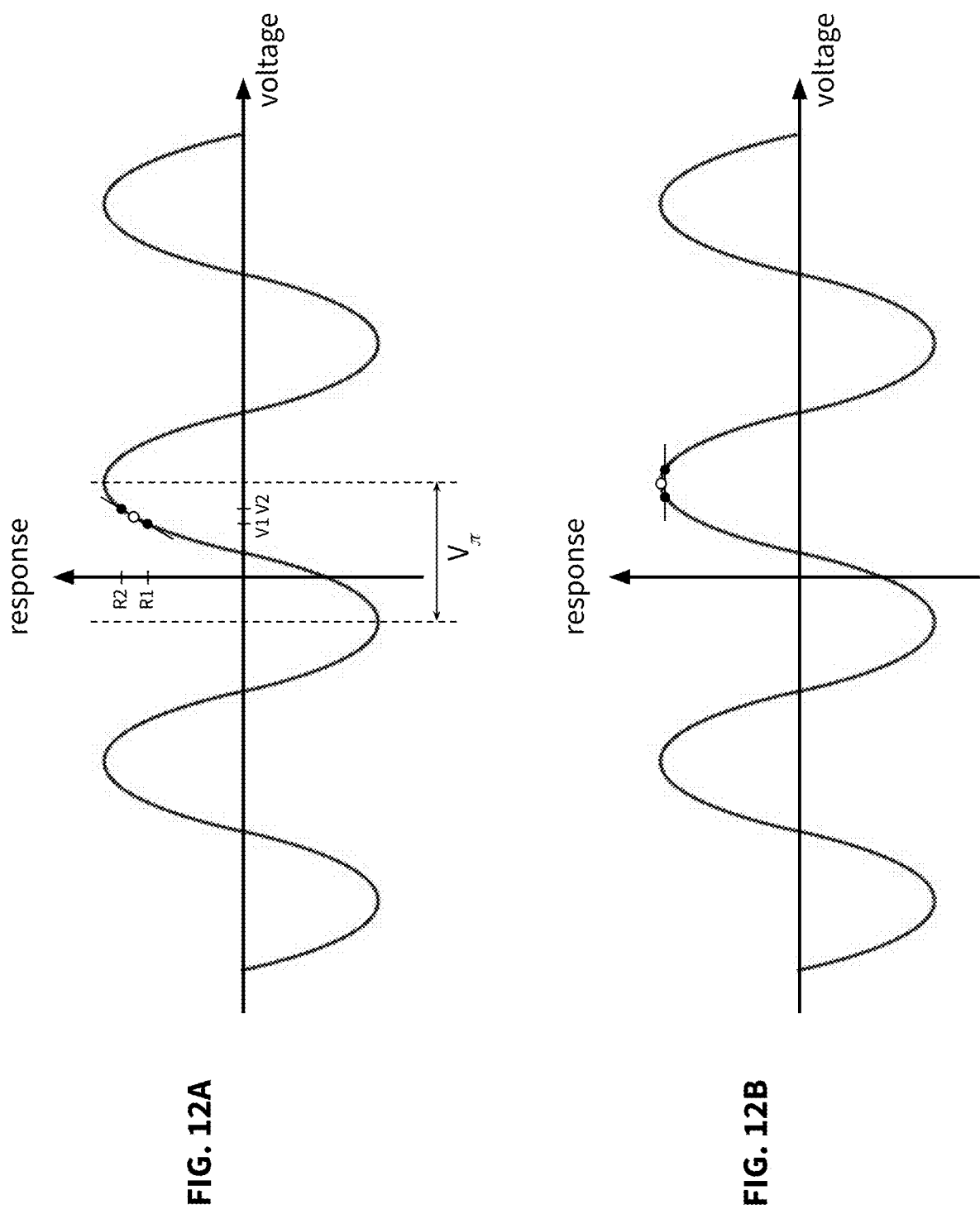
FIGS. 12A and 12B illustrate sample switch response curves of a MUX switch compatible with embodiments of the present disclosure.

FIGS. 12A and 12B illustrate an exemplary switch response curve. The response of a switch to an applied DC bias voltage is correlated with the transmittance of an optical signal being routed through the switch. For example, the maximum point of the response curve may correspond to maximum transmittance of the optical signal from the upper input port to the upper output port of the switch (i.e., the optimal operating point for bar configuration), while the minimum point of the response curve may correspond to minimum transmittance of the optical signal from the upper input port to the upper output port of the switch (i.e., the optimal operating point for cross configuration). Equivalently, the maximum point of the response curve may also correspond to minimum transmittance of the optical signal from the upper input port to the lower output port of the switch (i.e., the optimal operating point for bar configuration), while the minimum point of the response curve may also correspond to maximum transmittance of the optical signal from the upper input port to the lower output port of the switch (i.e., the optimal operating point for cross configuration).

During the bias locking time interval, the photodetector measurements may be received by controller 1106 and used to determine and apply an appropriate shift to the set point bias voltage. In some embodiments, a dithering technique may be implemented by the controller 1106 to determine the set point bias voltage to operate each switch at its optimal transmittance point. In some embodiments, the controller 1106 may be implemented using one of: a graphics processing unit (GPU), a central processing unit (CPU), a field programmable gate array (FPGA), an application-specific integrated circuit (ASIC), or any suitable processing device.

Referring to FIGS. 12A and 12B, in implementing a dithering scheme by the controller 1106, two dithering bias voltages V1 and V2 are sequentially applied to the switch to be bias locked. In some embodiments, the two dithering bias voltages are set such that the current set point bias voltage (indicated in FIGS. 12A and 12B by a hollow circle) is the average of the two dithering bias voltages. A first switch response R1 to the first dithering bias voltage V1 is obtained by the photodetector D3. The switch response R1 may be detected in terms of light intensity or power, or any other suitable photonic signal properties indicative of the amount of light transmitted through the switch. The second dithering bias voltage V2, different from the first dithering bias voltage V1, is then applied to the same switch, and a second switch response R2 may be obtained in a similar fashion by the photodetector D3. In some embodiments, the two switch responses R1 and R2 may each be determined as the average of multiple measurements (e.g., 20 measurements in 20 cycles) to account for noise and signal fluctuations.

A slope of the response function at the set point bias voltage based on the two dithering bias voltages V1, V2 may be estimated as (R2–R1)/(V1–V1), where the slope is indicative of the rate of change in switch response with respect to the bias voltage. In addition, the slope may also indicate the direction of the set point bias voltage shift to be applied. In some embodiments, a positive slope (as shown in FIG. 12A) is indicative of a need to increase the set point bias voltage in order to shift the operating point towards the peak of the switch response curve. A negative slope is indicative of the need to decrease the set point bias voltage. If the slope exceeds a threshold value, a voltage shift may be applied to adjust the set point bias voltage. The voltage shift may be applied in any suitable manner. In some embodiments, the voltage shift may be applied in fixed increments. In further embodiments, the size of the voltage shift may be directly proportional to the slope value where a higher absolute slope value may correspond to a greater voltage shift, and vice versa. Once the slope value is 0 or at a value within a tolerance range of 0 as shown in FIG. 12B, the switch may be said to be operating at maximum transmittance and the DC switch bias is maintained, or locked. The dithering scheme may be repeated iteratively, until the rate of change in switch response is equal to or below the threshold value, at which point the switch is said to be bias locked.

In cases where a single proxy signal is used to perform bias locking, it may be preferable to perform dithering to determine the maximum transmittance point of the switch response curve. In such embodiments, once the maximum switch transmittance point is determined through dithering, the minimum transmittance point may be determined to be at half a period away from the maximum transmittance point along the switch response curve, as indicated by $V_\pi$ in FIG. 12A.

The value of $V_\pi$ can be determined via a switch calibration process. In some embodiments, the calibration process is a random bias voltage dithering method that includes setting the bias voltage to a random value and using the dithering scheme to determine a first bias voltage value corresponding to a maximum of the switch response curve. Then, the bias voltage is again set to the same random value, and the dithering scheme is used to determine a second bias voltage value corresponding to a minimum of the switch response curve. Note that the dithering scheme described above can be modified to locate a minimum of the switch response curve by reversing the direction of the change in bias voltage with respect to the slope. To account for noise, this procedure can be repeated multiple (e.g., 100) times and the average difference between the first and second bias voltage values can be set as the estimate of $V_\pi$.

In some alternative embodiments, the calibration process may make use of both of the interleaved signals input to a switch to determine the value of $V_\pi$. For example, a $V_\pi$ sweeping method may be used wherein a first interleaved signal is used to continually bias lock the switch at a set point bias voltage $V_{SP}$ using the dithering scheme described above, while a second interleaved signal is used to "sweep" through a range of potential $V_\pi$ values. To do this, the two interleaved signals input to a switch, such as interleaved signals 1A and 1B at switch S1 in FIG. 11, are interleaved with two proxy signals that alternate between successive time intervals, such as the proxy signals A and B in signals 606 and 608, respectively. The first time interval may be used to bias lock switch S1 at the set point bias voltage $V_{SP}$ corresponding to the bar configuration based on the proxy signal in interleaved signal 1A. The second time interval may then be used to determine the response of switch S1 based on the proxy signal in interleaved signal 1B at a bias voltage equal to $V_{SP}+V_\pi^{sweep}$, where $V_\pi^{sweep}$ is the potential $V_\pi$. When $V_\pi^{sweep}$ is equal to the true value of $V_\pi$, switch S1 is in the optimal cross configuration, and so the signal strength of the proxy signal in interleaved signal 1B detected at D3 will be at a maximum. Therefore, $V_\pi$ may be determined by sweeping through a range of $V_\pi^{sweep}$ values during the second time interval, while the switch S1 is bias locked at the set point bias voltage $V_{SP}$ during the first time interval. In some embodiments, to account for noise, a large number of $V_\pi^{sweep}$ values (e.g., 1000 values) are swept through and the data is smoothed with a Gaussian kernel before determining the maximum.

In some embodiments, $V_\pi$ need not be determined and the switch calibration process may be bypassed. In such embodiments, the switch is continually bias locked at two different set point bias voltages, with the two set point bias voltages corresponding to adjacent maxima of the switch response curve. That is, the dithering scheme may be used to bias lock the switch at a first set point bias voltage corresponding to a maximum of the switch response curve. The dithering scheme may then be used to bias lock the switch at a second set point bias voltage corresponding to a maximum of the switch response curve that is one period away from the first set point bias voltage. In some embodiments, the two set point bias voltages are continually locked in an alternating fashion. By continually bias locking the switch at both set point bias voltages, the bias voltage corresponding to the minimum of the switch response curve can be taken as the halfway point between the two set point bias voltages, and the calibration process to determine the value of $V_\pi$ is obviated. In some embodiments, one of the two set point bias voltages is at a positive voltage value while the other set point bias voltage is at a negative voltage value. In such embodiments, the amount of time spent locking each of the set point bias voltages relative to the other may be used advantageously. The switch response curve has a tendency to drift in the direction of the applied voltage (i.e., it drifts to the right when a positive voltage is applied, and to the left when a negative voltage is applied). Therefore, the amount of time spent locking each of the two set point bias voltages relative to each other can be actively controlled such that the halfway point between the two set point bias voltages (i.e., the minimum of the switch response curve) is substantially maintained at a voltage of zero.

Figure 13:
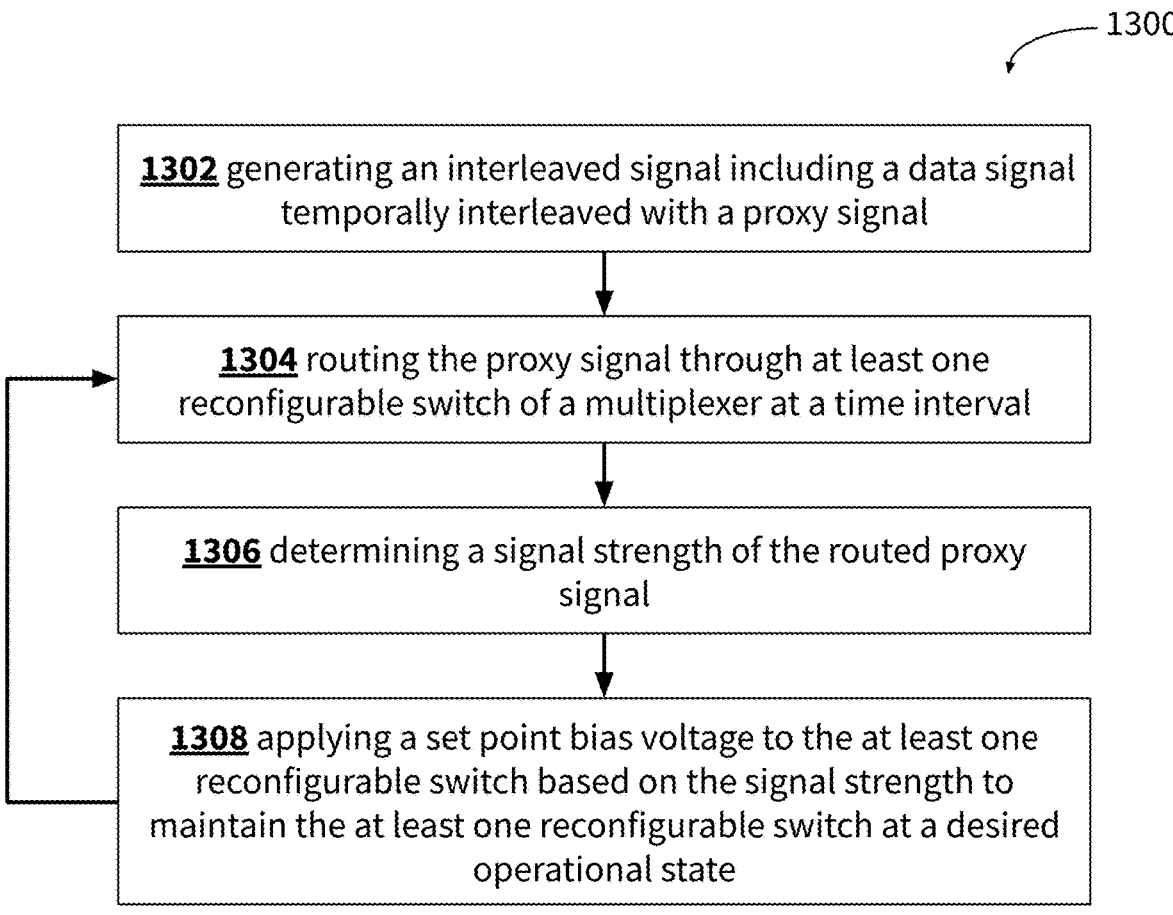
FIG. 13 illustrates a flowchart for an exemplary method in accordance with the present disclosure that may be used for bias locking a reconfigurable switch in a multiplexer.

FIG. 13 illustrates a flowchart for an exemplary method 1300 in accordance with the present disclosure that may be used for bias locking a reconfigurable switch in a multiplexer.

At 1302, an interleaved signal is generated by temporally interleaving a data signal with a proxy signal. The data signal and the proxy signal are interleaved in such a way that they are temporally independent of one another. In some embodiments, the proxy signal may be a pulse signal.

At 1304, the interleaved signal is received by a multiplexer that is configured to route the interleaved signal through at least one reconfigurable switch of the multiplexer. The multiplexer is configured to route the data signal based on a routing criteria, such as a PNR pattern. In the time interval between consecutive data signal routing operations, the multiplexer is configured to route the proxy signal, through a signal path, to a photodetector. The signal path may include one or more switches of the multiplexer as best shown in FIG. 11.

At 1306, the photodetector is configured to detect a signal strength of the routed proxy signal.

At 1308, a controller is configured to apply a set point bias voltage to the at least one reconfigurable switch based on the detected signal strength of the proxy signal to maintain the at least one reconfigurable switch at a desired operational state. In some embodiments, the operational state is defined by the transmittance of the switch.

In some embodiments, the signal strength is determined by performing a plurality of iterations, where in each iteration two dithering bias voltages configured such that the set point bias voltage is the average of the two dithering bias voltages are applied to the at least one reconfigurable switch. A first switch response to the first dithering bias voltage is detected by the photodetector. The first switch response may be measured as the average signal strength over a plurality of time intervals. A second dithering bias voltage, different from the first dithering bias voltage, is applied to the at least one reconfigurable switch, and a second switch response to the second dithering bias voltage is measured by the photodetector, for example by a similar method as that of the first switch response. A rate of change in the routed proxy signal strength in response to the two dithering bias voltages is determined. The controller then adjusts the set point bias voltage until the rate of change is less than a threshold value. In some embodiments, the set point bias voltage is adjusted by fixed increments. In further embodiments, the adjustments are proportional to the rate of change. For example, a large absolute value of the rate of change may correspond to a larger adjustment, and a small absolute value of the rate of change may correspond to a small adjustment. Once the rate of change is less than a threshold value, the switch is said to be operating at a desired operational state, such as a state of maximum transmittance for a given switch configuration.

Steps 1304 to 1308 may be repeated during operation of the MUX such that the bias voltages are continually monitored and updated in response to any drift in the maximum and minimum transmittance bias voltages for a given switch configuration.

In some embodiments, a set point bias voltage that corresponds to a minimum transmittance state is determined. In some embodiments, the minimum transmittance state and its corresponding set point bias voltage is set as the point half of a period away from the maximum transmittance point on the response curve of a MUX switch in one of a bar configuration and a cross configuration. The response curve of a switch is best illustrated in FIGS. 12A and 12B, where half of a period is indicated by $V_\pi$. $V_\pi$ may be determined in a calibration process, such as the random bias voltage dithering method and $V_\pi$ sweep method as described above. In some further embodiments, $V_\pi$ need not be determined and the minimum transmittance state is instead continually bias locked in a similar manner as the maximum transmittance state. For example, a reconfigurable switch of the MUX is configured to receive and route two interleaved signals: a first interleaved signal comprising a first data signal interleaved with a first proxy signal and a second interleaved signal comprising a second data signal interleaved with a second proxy signal. The two proxy signals have identical periods, but the second proxy signal is temporally offset from the first proxy signal by half of a period. The switch is configured in one of a bar configuration and a cross configuration when routing the first proxy signal, and is configured in the other configuration when routing the second proxy signal. A maximum transmittance operational state of the reconfigurable switch based on the second proxy signal can be determined in a similar manner as described above. Due to the different switch configurations when routing the two proxy signals, the maximum transmittance state as determined using the second proxy signal coincides with, and is set as, the minimum transmittance state for the first proxy signal. Hence, the switch may be bias locked at both bias voltages: one corresponding to the optimal operation of the switch in the bar configuration, and the other corresponding to the optimal operation of the switch in the cross configuration, obviating the need to determine $V_\pi$ via a calibration process.

Although the present disclosure may describe methods and processes with steps in a certain order, one or more steps of the methods and processes may be omitted or altered as appropriate. One or more steps may take place in an order other than that in which they are described, as appropriate.

Although the present disclosure may be described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, an FPGA, a CPU, a GPU, an ASIC, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. An optical device comprising:
a source generating an interleaved signal including a data signal temporally interleaved with a proxy signal;
a photodetector configured to detect a signal strength;
a multiplexer configured to receive the interleaved signal, the multiplexer including at least one reconfigurable switch configured to route the proxy signal to the photodetector during a time interval; and
a controller configured to apply a set point bias voltage to the at least one reconfigurable switch based on the detected signal strength of the proxy signal to maintain the at least one reconfigurable switch at a desired operational state.

2. The optical device of claim 1, wherein the time interval is a portion of the time between successive routing operations of the data signal by the at least one reconfigurable switch.

3. The optical device of claim 1, wherein the set point bias voltage is determined over a plurality of iterations, in each iteration:
the controller is further configured to apply a first dithering bias voltage to the at least one reconfigurable switch;
the photodetector is further configured to detect a first switch response based on the first dithering bias voltage;
the controller is further configured to apply a second dithering bias voltage, different from the first dithering bias voltage, to the at least one reconfigurable switch;
the photodetector is further configured to detect a second switch response based on the second dithering bias voltage; and
when a rate of change between the first and second switch responses is greater than a threshold value, the controller is further configured to apply an incremental change to the set point bias voltage.

4. The optical device of claim 3, wherein the set point bias voltage is the average of the first dithering bias voltage and the second dithering bias voltage.

5. The optical device of claim 3, wherein the incremental change to the set point bias voltage is one of a fixed increment and a proportional value corresponding to the rate of change in the switch response.

6. The optical device of claim 1, wherein the at least one reconfigurable switch is a lithium niobate switch.

7. The optical device of claim 1, wherein the desired operational state is at a maximum of a response curve of the at least one reconfigurable switch.

8. The optical device of claim 7, wherein the controller is further configured to determine a minimum of the response curve.

9. The optical device of claim 8, wherein the controller is configured to determine the minimum of the response curve as half a period away from the maximum of the response curve.

10. The optical device of claim 8, wherein the proxy signal is a first proxy signal, the rate of change is a first rate of change, the set point bias voltage is a first set point bias voltage, the threshold value is a first threshold value, the desired operational state is a first configuration and the first set point bias voltage corresponds to the first configuration, and the controller is further configured to configure the at least one reconfigurable switch to a second configuration;
the multiplexer is further configured to receive a second proxy signal of a second interleaved signal through the at least one reconfigurable switch, the second proxy signal being offset from the first proxy signal by half of a period of the first proxy signal; and
a second set point bias voltage corresponding to the second configuration is determined over a plurality of iterations, in each iteration:
the controller is further configured to apply a third dithering bias voltage to the at least one reconfigurable switch;
the photodetector is further configured to detect a third switch response based on the third dithering bias voltage;
the controller is further configured to apply a fourth dithering bias voltage, different from the third dithering bias voltage, to the at least one reconfigurable switch;
the photodetector is further configured to detect a fourth switch response based on the fourth dithering bias voltage;
the controller is further configured to determine a second rate of change between the third and fourth switch responses;
when the second rate of change is greater than a second threshold value, the controller is further configured to apply an incremental change to the second set point bias voltage; and
the controller is further configured to set the second set point bias voltage as the minimum of the response curve of the at least one reconfigurable switch.

11. An optical system, comprising:
a plurality of sources configured to generate a plurality of interleaved signals, each interleaved signal of the plurality of interleaved signals including a data signal temporarily interleaved with a proxy signal;
a plurality of photodetectors, each photodetector of the plurality of photodetectors configured to detect a signal strength;
a multiplexer configured to receive the plurality of interleaved signals, the multiplexer including a plurality of reconfigurable switches, each reconfigurable switch of the plurality of reconfigurable switches being configured to route the proxy signal to a photodetector of the plurality of photodetectors during a time interval; and
a controller configured to apply a set point bias voltage to one or more reconfigurable switches of the plurality of reconfigurable switches based on the detected signal strength of the proxy signal to maintain the plurality of reconfigurable switches at desired operational states.

12. The system of claim 11, wherein the plurality of switches form one or more signal paths, each signal path of the one or more signal paths being operably coupled to a photodetector of the plurality of photodetectors.

13. The system of claim 12, wherein the switches in each signal path of the one or more signal paths are maintained at desired operational states sequentially.

14. A method comprising:

generating an interleaved signal including a data signal temporally interleaved with a proxy signal;

routing the proxy signal through at least one reconfigurable switch of a multiplexer during a time interval;

determining a signal strength of the routed proxy signal; and applying a set point bias voltage to the at least one reconfigurable switch based on the signal strength to maintain the at least one reconfigurable switch at a desired operational state.

15. The method of claim 14, wherein the determining further comprises a plurality of iterations, each iteration comprising:

applying a first dithering bias voltage to the at least one reconfigurable switch;

detecting a first switch response based on the first dithering bias voltage;

applying a second dithering bias voltage, different from the first dithering bias voltage, to the at least one reconfigurable switch;

detecting a second switch response based on the second dithering bias voltage; and when a rate of change between the first and second switch responses is greater than a threshold value, applying an incremental change to the set point bias voltage.

16. The method of claim 15, wherein the incremental change is a fixed increment.

17. The method of claim 15, wherein the incremental change is proportional to the rate of change.

18. The method of claim 14, wherein the desired operational state is a maximum of a response curve of the at least one reconfigurable switch, and the method further comprises determining a minimum of the response curve of the at least one reconfigurable switch.

19. The method of claim 18, wherein the determining of the minimum of the response curve further includes determining a bias voltage value that is half a period away from the maximum of the response curve of the at least one reconfigurable switch.

20. The method of claim 18, wherein the proxy signal is a first proxy signal, the rate of change is a first rate of change, the set point bias voltage is a first set point bias voltage, the threshold value is a first threshold value, the desired operational state is a first configuration and the first set point bias voltage corresponds to the first configuration, further including:

configuring the at least one reconfigurable switch to a second configuration;

routing a second proxy signal of a second interleaved signal through the at least one reconfigurable switch of the multiplexer, the second proxy signal being offset from the first proxy signal by half of a period of the first proxy signal;

determining a second set point bias voltage corresponding to the second configuration over a plurality of iterations, each iteration comprising:

applying a third dithering bias voltage to the at least one switch;

detecting a third switch response based on the third dithering bias voltage;

applying a fourth dithering bias voltage to the at least one switch;

detecting a fourth switch response based on the fourth dithering bias voltage;

when a second rate of change between the third and fourth switch responses is greater than a second threshold value, applying an incremental change to the second set point bias voltage; and setting the second set point bias voltage as the minimum of a response curve of the at least one reconfigurable switch.

* * * * *